United States Patent
Zhang et al.

(10) Patent No.: US 9,917,607 B1
(45) Date of Patent: Mar. 13, 2018

(54) BASELINE WANDER CORRECTION GAIN ADAPTATION

(71) Applicant: Oracle International Corporation, Redwood City, CA (US)

(72) Inventors: Xun Zhang, Westford, MA (US); Dawei Huang, San Diego, CA (US); Jianghui Su, San Jose, CA (US); Chaitanya Palusa, Fremont, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/449,619

(22) Filed: Mar. 3, 2017

(51) Int. Cl.
| | |
|---|---|
| H04L 25/03 | (2006.01) |
| H04B 1/16 | (2006.01) |
| H03G 3/30 | (2006.01) |
| H03M 1/66 | (2006.01) |

(52) U.S. Cl.
CPC .............. *H04B 1/16* (2013.01); *H03G 3/3036* (2013.01); *H03M 1/66* (2013.01); *H04L 25/03057* (2013.01)

(58) Field of Classification Search
CPC ......... H04B 1/16; H03G 3/3036; H03M 1/66; H04L 25/03057
See application file for complete search history.

(56) References Cited

U.S. PATENT DOCUMENTS

| | | | |
|---|---|---|---|
| 9,106,462 B1* | 8/2015 | Aziz | H04L 25/03057 |
| 2007/0286315 A1* | 12/2007 | Hong | H04L 25/03057 |
| | | | 375/345 |
| 2008/0159415 A1* | 7/2008 | Miller | H04L 25/0266 |
| | | | 375/258 |
| 2012/0155528 A1* | 6/2012 | Zhong | A61B 5/7225 |
| | | | 375/232 |

* cited by examiner

*Primary Examiner* — Syed Haider
(74) *Attorney, Agent, or Firm* — Marsh Fischmann & Breyfogle LLP; Kent A. Lembke

(57) ABSTRACT

Embodiments include systems and methods for baseline wander correction gain adaptation in receiver circuits. Some embodiments operate in context of an alternating current coupled transceiver communicating data signals over a high-speed transmission channel, such that the receiver system includes an AC-coupled data input and a feedback loop with a data slicer and an error slicer. A baseline wander correction (BWC) circuit can be part of the feedback loop and can generate a feedback signal corresponding to low-pass-filtered bits data from the data slicer output and having a gain generated according to pattern-filtered error data from the error slicer output. For example, gain adaptation is performed according to error information corresponding to a detected relatively high-frequency data pattern following a long low-frequency pattern.

24 Claims, 6 Drawing Sheets

US 9,917,607 B1

BASELINE WANDER CORRECTION GAIN ADAPTATION

FIELD

Embodiments relate generally to receiver circuits, and, more particularly, to techniques for baseline wander correction gain adaptation in receiver circuits.

BACKGROUND

Receiver circuits, such as serializer/deserializer (SERDES) circuits, are ubiquitous in many computational environments. For example, in computational environments having high-speed data channels, a transmitter sends data as a signal across a channel, and a receiver receives the signal from the channel and seeks reliably to recover the data from the signal. Some receiver circuits include a direct-current-coupled (DC-coupled), or common-mode-matched, input. However, common mode variation and other issues can tend to frustrate reliable operation of such implementations. Recently, it has become more common for receiver circuits to include an alternating-current-coupled (AC-coupled) input. Such implementations typically include a DC blocking capacitor for removing common-mode from the differential data signal, and the DC blocking capacitor is typically implemented on the receiver die. Area limitations on the die tend to limit the size of the capacitor, and use of such smaller capacitors can tend to result in a high pole frequency for the receiver. The high pole frequency can cause the baseline of the received data signal to wander as a function of the data pattern.

BRIEF SUMMARY

Among other things, embodiments provide novel systems and methods for baseline wander correction gain adaptation in receiver circuits. Some embodiments operate in context of an alternating current coupled (AC-coupled) transceiver communicating data signals over a high-speed transmission channel, such that the receiver system includes an AC-coupled data input. The receiver system also includes a bit detector having a feedback loop (e.g., implemented as a clock data recovery (CDR) circuit, or the like). For example, the bit detector includes a summer circuit coupled with the AC-coupled data input, and coupled with a feedback input, and having a summer output, where the summer output is generated according to a sum of the AC-coupled data input and the feedback input. A feedback circuit can be coupled with the summer output (e.g., via an equalization and amplification circuit) and can have a data slicer output and an error slicer output. The data slicer output can include data samples generated according to the summer output, and the error slicer output can include error samples generated according to the summer output. A baseline wander correction (BWC) circuit can be coupled with the data slicer output and the error slicer output, and can have a feedback output coupled with the feedback input of the summer circuit. The feedback output can be generated by low-pass filtering a feedback data signal generated according to the data slicer output and having a gain generated according to the error slicer output. Embodiments generate the gain in a manner that robustly adapts to pattern-filtered error data. For example, gain adaptation is performed according to a relatively high-frequency data pattern detected as following a long low-frequency pattern.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
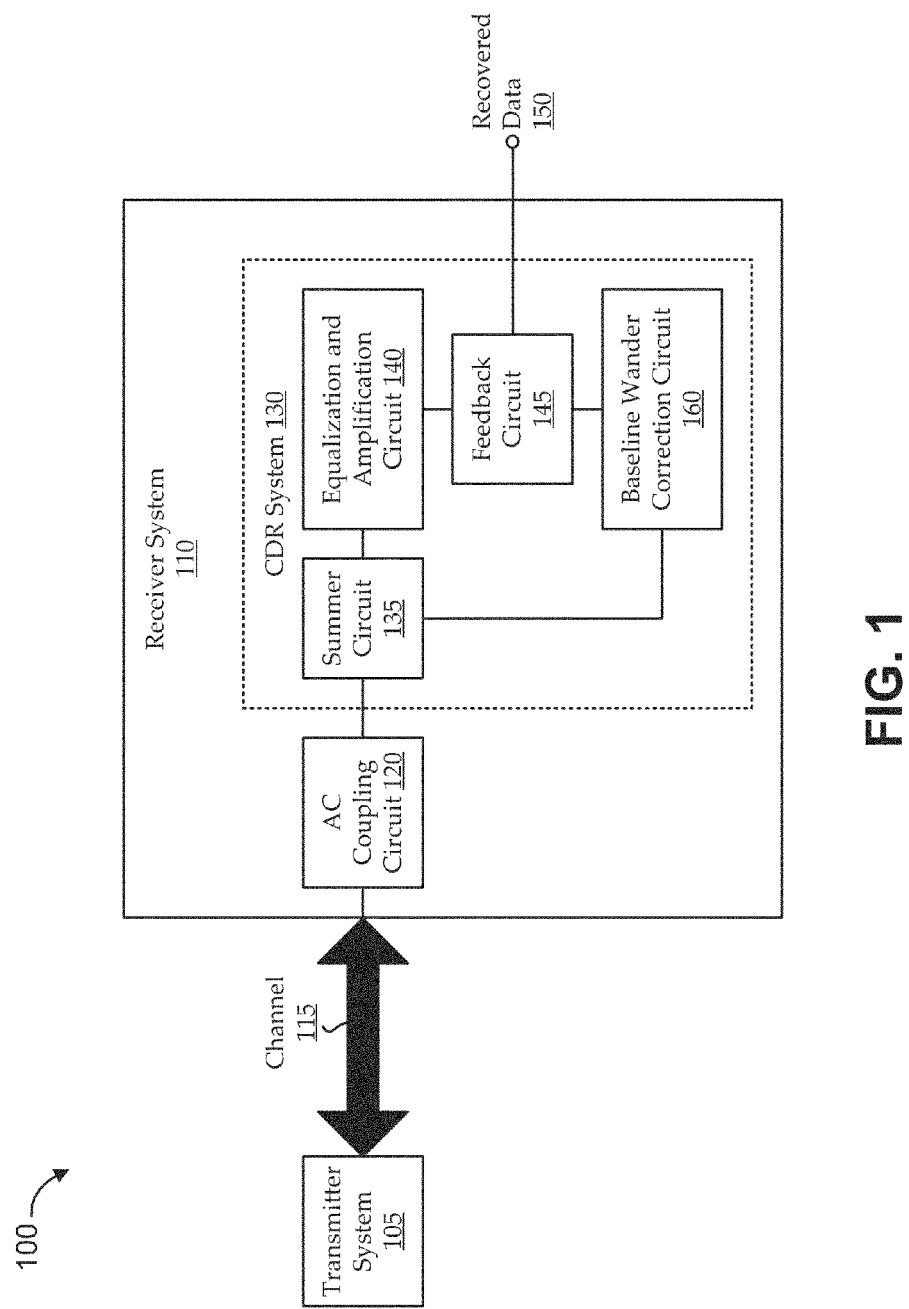
FIG. 1 shows a block diagram of an illustrative communications environment, according to various embodiments.

FIG. 1 shows a block diagram of an illustrative communications environment 100, according to various embodiments. Many electronics applications include communications channels that have transmitter systems 105 and receiver systems 110 to move data through the electronics application via data channels 115. For example, the transmitter system 105 can include any suitable components, such as a driver, for communicating data over the data channel 115. The data channel 115 can be any parallel or serial, wired or wireless, or other suitable communications channel for carrying the data. The receiver system 110 can be implemented in any suitable manner, for example as an integrated circuit that is part of and/or in communication with very-large-scale integration VLSI circuits, communication systems, storage area networks, local area networks, wide area networks, data centers, memory components, electronic devices, memory systems, and/or computer systems (such as multiple-core processor computer systems, computer systems that include components that communicate via capacitive proximity communication, computer systems that include components that communicate via optical proximity communication, etc.).

Some receiver systems 110 include serializer/deserializer (SERDES) receiver circuits that can, for example, convert parallel data from the data channel 115 into a serial data stream for processing, etc. Various functions of the SERDES, and/or other receiver systems 110, include a clock data recovery (CDR) system 130. The CDR system 130 seeks to recover a clock signal from the received data signal, and the recovered clock signal can be used to recover (e.g., sample) data bits from the received data signal. When link margin decreases, it can become more difficult to reliably recover data bits from the received data signal. For example, CDR systems 130 typically seek to adjust the phase of the recovered clock signal (e.g., using feedback adaptation to compensate for inter-channel interference, clock jitter, and/or other factors), so as to sample data bits close to the center of the "data eye" where there is high link margin.

For example, the illustrated CDR system 130 includes at least a summer circuit 135, an equalization and amplification circuit 140, and a feedback circuit 145. While the receiver system 110 is illustrated as a simplified functional block diagram to avoid overcomplicating the description and figures, these simplifications should not be construed as limiting embodiments and implementations. The receiver system 110 can include fewer or additional components, and the various functional blocks can each be implemented as one or more discrete components, combined with other functional blocks into a single component, implemented in any suitable architecture or arrangement, etc. For example, the receiver system 110 includes any suitable components for receiving a data signal from the data channel 115 and reliably outputting data 150 as desired by other systems or components in communication with the receiver system 110. Generally, components of the CDR system 130 sample and process the received data signal according to a clock signal recovered from the data signal (e.g., largely performed by the equalization and amplification circuit 140), output the samples as output data 150 (recovered data bits), generate a feedback signal for use in adapting the sampling and processing of the received data signal (e.g., largely performed at least by the feedback circuit 145 for adjusting the recovered clock phase, adding back lost signal components, etc.), and adding the feedback signal back into the received signal (e.g., performed by the summer circuit 135). Embodiments of the equalization and amplification circuit 140 can include amplifiers, filters, decision feedback equalizer, a linear equalizer, a feed-forward equalizer, and/or any other suitable components.

As illustrated, some receiver systems 110 also include an alternating current (AC) coupling circuit 120. The AC-coupling can impact link margin due to baseline wander, as described herein. For example, it is desirable in many computational applications to include alternating-current-coupled (AC-coupled) transceiver circuits. In such systems, the receiver circuit can include an AC-coupled input (illustrated as the AC coupling circuit 120) that has a DC blocking capacitor for removing common-mode from the differential data signal. The DC blocking capacitor is typically implemented on the receiver die (e.g., to avoid insertion loss and discontinuity that can be caused by onboard capacitors), and area limitations on the die can tend to limit the size of the capacitor. Use of such smaller capacitors can tend to result in a high pole frequency for the receiver. The high pole frequency can cause the baseline of the received data signal to wander as a function of the data pattern. For example, longer strings of consecutive data bits can generate larger amounts of baseline wander because a long string of '1's or '0's can cause the capacitor to charge or discharge according to a time constant of a resistor-capacitor (RC) network including the capacitor and resistive elements.

The baseline wander can reduce the link margin (e.g., the link margin can become asymmetric). As described above, reduction in link margin can frustrate attempts to accurately recover data bits from a received data signal. Therefore, some implementations of receiver systems 110 having AC-coupled inputs (e.g., an AC coupling circuit 120) also include a baseline wander correction (BWC) circuit 160. The BWC circuit 160 can seek to predict an amount of baseline shift and to mitigate the effect before the signal reaches the bit detector.

Conventional baseline wander correction approaches tend to have various limitations. For example, effective BWC can involve determining what signal to add back in the bit detector feedback loop (e.g., what signal is being lost due to the AC coupling circuit 120) and how much signal to add back (e.g., compensating for lost gain due to the AC coupling circuit 120). Some conventional approaches predict channel characteristics and hard code gain parameters in the BWC circuitry. However, any variations in the channel over time from the predicted channel characteristics (e.g., due to changes in temperature, etc.) can decrease the effectiveness of the hard-coded gain compensation and can reduce link margin. Some other conventional approaches can detect error signal bias (e.g., asymmetry) and can adapt gain compensation accordingly. However, such approaches have tended to be noisy and unstable.

Embodiments described herein provide BWC approaches that include novel gain adaptation. Such novel gain adaptation can improve determinations of what signal to add back into a bit detector feedback loop of the CDR system 130 and how much of the signal to add back. Gain adaptation can include pattern filtering prior to using error signal information for gain adaptation. Baseline wander results from data patterns that have significant low frequency content (e.g., long strings of '1's or '0's). However, embodiments described herein counter-intuitively recognize that the low-frequency patterns are not suited for gain adaptation, as the error signal for such patterns tends to show bias even without baseline wander. Instead, embodiments detect a high-frequency pattern immediately following a low-frequency pattern and use such a pattern for gain adaptation. With such patterns, the error signal tends to be dominated by residual baseline wander when the correction gain is not correct, such that gain adaptation corrections can be more robustly performed in response to detecting such patterns. Increasing the robustness of the BWC gain adaptation can provide various features. For example, the gain adaptation can be left on during mission mode of a computational platform (e.g., rather than leaving it on only during test or diagnostic modes of operation), and such gain adaptation can help to simplify link tuning and to track gain variation due to voltage and temperature changes.

Figure 2:
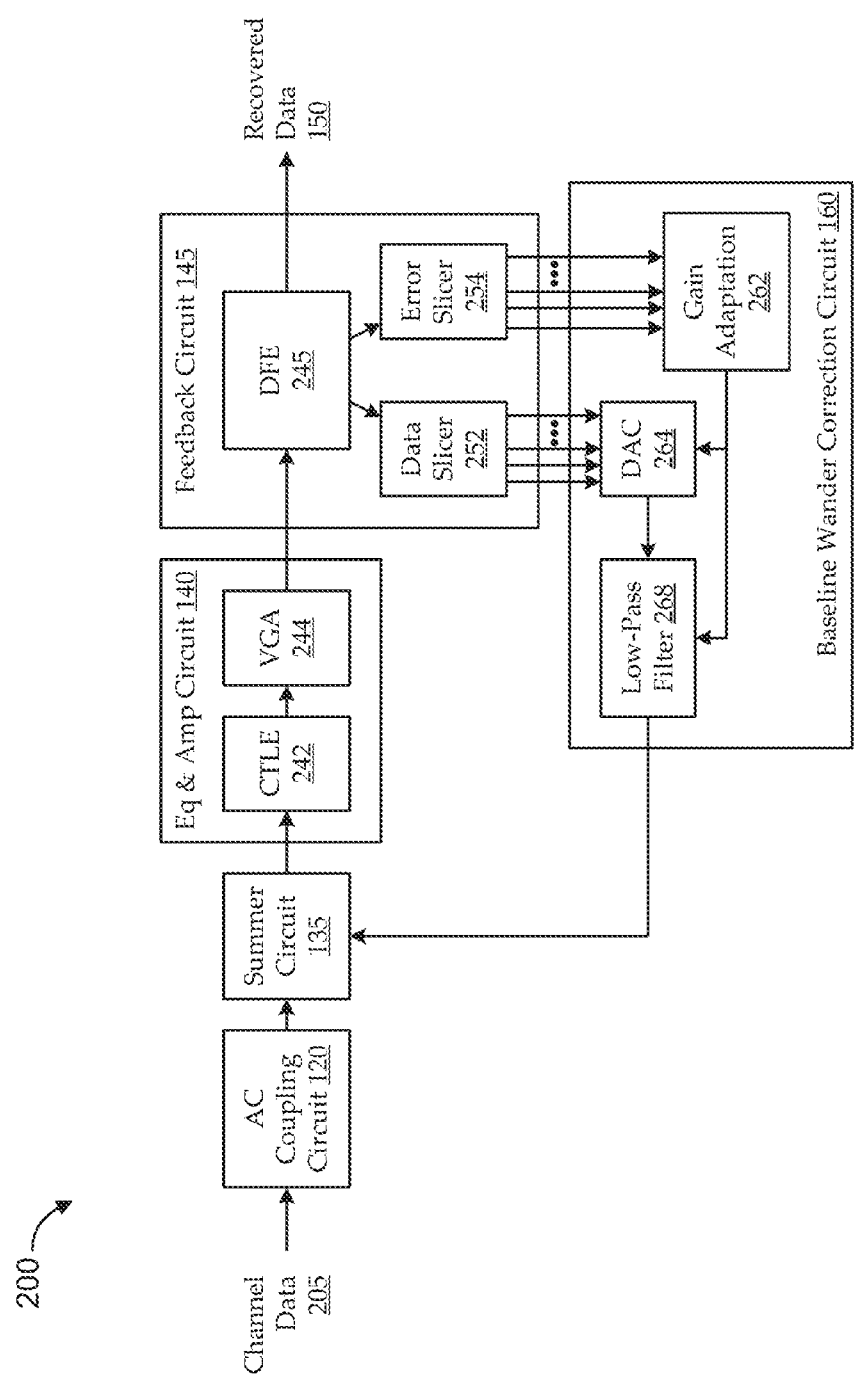
FIG. 2 shows a block diagram of an illustrative receiver system that provides baseline wander correction, according to various embodiments.

FIG. 2 shows a block diagram of an illustrative receiver system 200 that provides baseline wander correction, according to various embodiments. The receiver system 200 can be an implementation of the receiver system 110 of FIG. 1. As illustrated, the receiver system 200 includes an AC coupling circuit 120, a summer circuit 135, an equalization and amplification circuit 140, a feedback circuit 145, and a baseline wander correction (BWC) circuit 160. Some embodiments of the equalization and amplification circuit 140 are implemented with a continuous time linear equalizer (CTLE) 242 and a variable gain amplifier (VGA) 244. Other embodiments can include other suitable equalizer and/or amplifier components. Some embodiments of the feedback circuit 145 include a decision feedback equalizer (DFE) 245, a data slicer 252, and an error slicer 254. Other embodiments can include other suitable feedback equalization components and/or components that output a data estimate and an error estimate.

During operation of the receiver system 200, the AC coupling circuit 120 can operate similar to a high-pass filter, effectively blocking lower-frequency information; and the lower-frequency information can include the relatively long streams of repeated bits (e.g., a long stream of '1's or a long stream of '0's). Embodiments of the BWC circuit 160 can use the data estimates from the data slicer 252 (or other suitable feedback circuit 145 component) and the error estimates from the error slicer 254 (or other suitable feedback circuit 145 component) to determine which signal (i.e., an estimate of the lost lower-frequency information) to add to the feedback loop and how much gain to apply to that signal to correct for baseline wander. As illustrated, embodiments of the BWC circuit 160 can include a gain adaptation circuit 262, a digital to analog converter (DAC) circuit 264, and an analog low-pass filter circuit 268.

The data slicer 252 can generate data bit estimates by sampling the recovered data signal 150 (or any suitable instance of the data signal passing through the feedback circuit 145) using a sampling clock recovered from that data signal. Implementations can consider the output of the data slicer 252 as an estimate of the low-frequency data being blocked by the AC coupling circuit 120. For example, implementations of the data slicer 252 can include an N-to-1 (e.g., 32-to-1) multiplexer, or the like, which can effectively provide a digital stream of data bit estimates slowed down to 1/N (e.g., 1/32) of the bandwidth (i.e., effectively a digital low-pass filter). This estimated digital low-pass output can be passed through the DAC circuit 264 of the BWC circuit 160 to produce an analog feedback signal that corresponds to an estimate of the signal filtered out by the AC coupling circuit 120.

Figure 3:
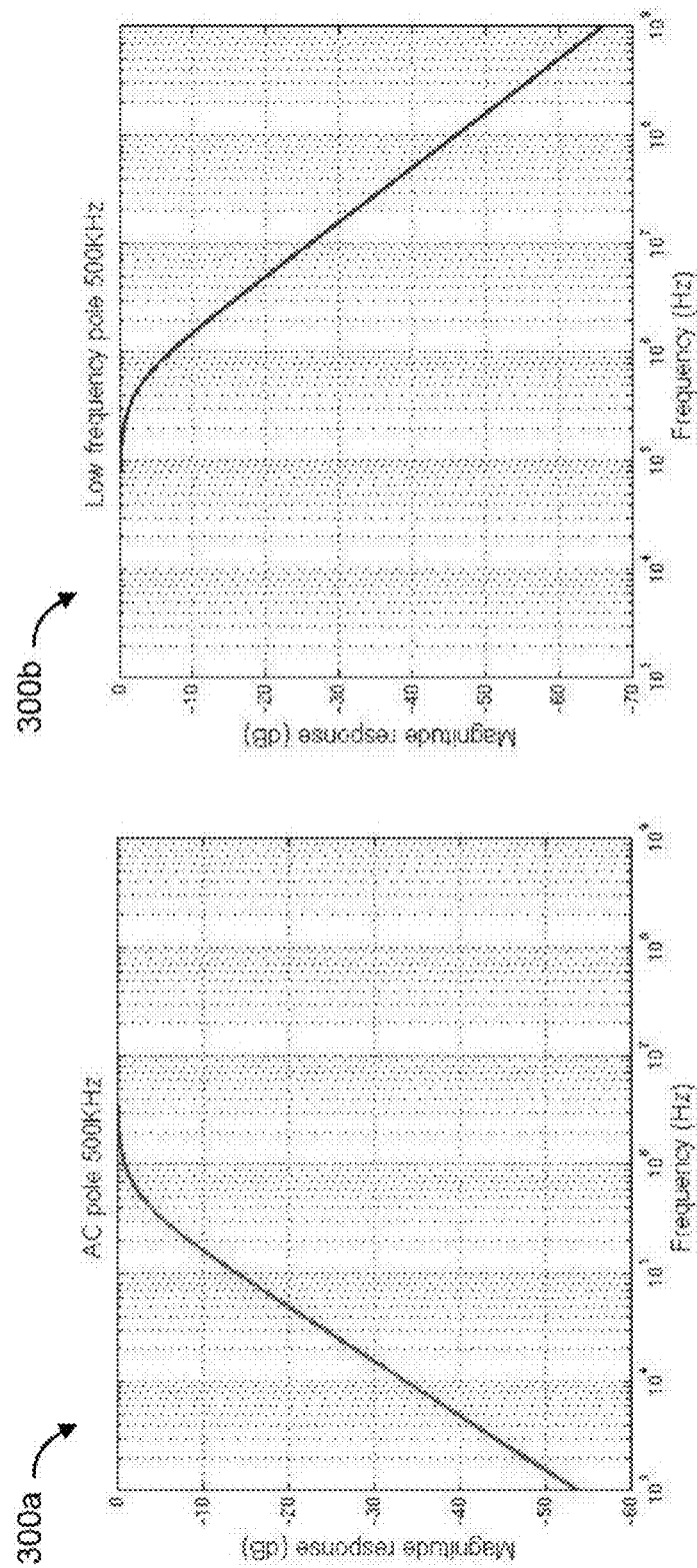
FIG. 3 shows two illustrative plots that demonstrate the frequency restoration sought by the digital to analog converter circuit.

For the sake of illustration, FIG. 3 shows two illustrative plots 300 that demonstrate the frequency restoration sought by the DAC circuit 264. One plot 300a shows an illustrative high-frequency pole of a typical AC coupling circuit 120. As illustrated, the high-pass filter effect of the AC coupling circuit 120 manifests an AC pole (e.g., a −3 dB point) at around 500 KHz. Embodiments design the path through the data slicer 252 and DAC circuit 264 (e.g., and, in some implementations, components of the analog low-pass filter circuit 268) to operate effectively as a low-pass filter with a pole substantially matching that of the AC coupling circuit 120. For example, the second plot 300b shows such a response with a low-frequency pole also at roughly 500 KHz. With such a configuration, the low-pass filtering functionality of the BWC circuit 160 can effectively restore the low-frequency components filtered out by the AC coupling circuit 120, thereby correcting for the shifting baseline.

Returning to FIG. 2, effective BWC involves both recovering which signal to feed back and determining an appropriate gain for that feedback signal. For example, the gain can be impacted by finite impulse response (FIR), transmission swing, channel loss, and/or other factors relating to the data channel and/or the transmitter; and these factors can manifest as error in the recovered data signal 150. The error slicer 254 can compare the recovered data signal 150 (or any suitable instance of the data signal passing through the feedback circuit 145) to an ideal signal to estimate an error sample. Some embodiments can include an M-to-1 multiplexer, or the like, which can effectively provide a digital stream of error estimates slowed down to 1/M of the bandwidth. Embodiments can be configured so that M and N are equal, or substantially similar so as to provide a comparable bandwidth. For example, a typical error slicer 254 can have a sampling rate of 16 UI (unit intervals), and M and N can be set to 32, accordingly. The digital error estimation output from the error slicer 254 can be passed to the gain adaptation circuit 262 of the BWC circuit 160, which can determine how much gain to apply to the analog feedback signal as a function of the error estimation.

Various approaches to baseline wander gain adaptation are based on the data pattern (e.g., the output of the data slicer 252) and/or the error pattern (e.g., the output of the error slicer 254). However, conventional approaches tend not to be effective in achieving the correct adaptation. One reason is that significant baseline wander tends only to occur with long strings of low-frequency patterns, which occur only with low probability. Further, effective gain adaptation can rely on longer low-frequency patterns (which occur at even lower probability) when there is a lower AC pole. Another reason is that use of typical error slicer outputs can rely on the error caused by baseline wander correction gain error being dominant over other error sources (e.g., loop adaptation error, etc.), which typically occurs only in the signal immediately following the long low frequency pattern. Another reason is that, with a lossy long channel, the signal swing at the receiver input can be small; as such, baseline wander is typically at a low voltage level, which can be difficult to use for gain error detection.

As illustrated, some embodiments of the BWC circuit 160 include an analog low-pass filter circuit 268. The analog low-pass filter circuit 268 can generate an analog feedback signal as a function of the output of the DAC circuit 264 and the output of the gain adaptation circuit 262. As described herein, the generated feedback signal can have frequency components corresponding to the low-pass information filtered out by the AC coupling circuit 120 and gain corresponding to transmitter and data channel errors.

Figure 4:
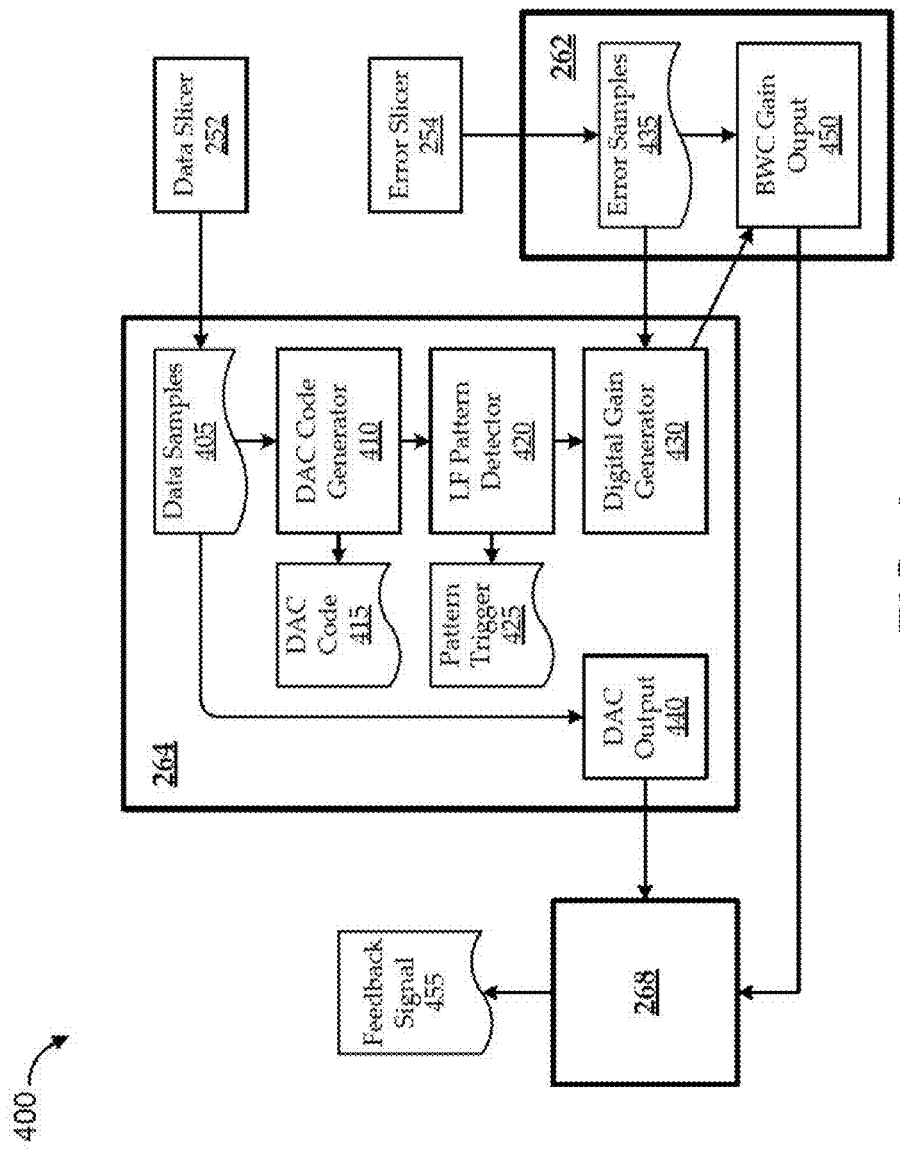
FIG. 4 shows a block diagram of an illustrative baseline wander correction system, according to various embodiments.

FIG. 4 shows a block diagram of an illustrative baseline wander correction (BWC) system 400, according to various embodiments. The illustrative BWC system 400 can include implementations of components of the BWC circuit 160 of FIGS. 1 and 2, including implementations of the DAC circuit 264, the gain adaptation circuit 262, and the analog low-pass filter circuit 268. The data slicer 252 and error slicer 254 are shown for context.

As illustrated, the DAC circuit 264 can include a DAC code generator 410, a low frequency pattern detector 420, a digital gain generator 430, and a DAC output 440. Embodiments of the DAC circuit 264 can receive data samples 405 from the data slicer 252. As described above, the data samples 405 can be data bit estimates sampled from a data signal according to a clock signal also recovered from the data signal. Implementations of the DAC code generator 410 characterize strings of data samples as a DAC code 415 representative of the string's composition of bits. In some implementations, the DAC code generator 410 can average the string of data samples 405 over a particular window (string length). One implementation sums a predetermined number (N) of sequential bits, multiplies the result by 2, and subtracts N. For example, where N=32, the DAC code 415 can be generated as $2*(d_k + d_{k-1} + \ldots d_{k-31}) - 32$. With such a computation, when all 32 bits in the accumulated window are '1', the DAC code 415 would be (2*32)−32=32; when all 32 bits in the accumulated window are '0', the DAC code 415 would be (2*0)−32=−32; and when all have the bits in the accumulated window are '1', and the other half are '0', the DAC code 415 would be (2*16)−32=0. A DAC code 415 further from zero (i.e., having a higher absolute value) represents a lower-frequency data pattern over the window, and a DAC code 415 closer to zero (i.e., having a lower absolute value) represents a higher-frequency data pattern. In some implementations, the DAC code 415 is expressed as a voltage level output. For example, the DAC code 415 can be represented in 8-millivolt increments (in the above implementation, the DAC code 415 can only be even, so that the minimum increment would practically be 16 millivolts). In some embodiments, the DAC code 415 itself can be used to look for larger patterns, such as by using a longer window of data samples 405 to look for longer low-frequency patterns.

In other embodiments, longer patterns are detected by the low frequency pattern detector 420. The low frequency pattern detector 420 can detect a predetermined sequential run length of valid DAC codes 415. In some implementations, the low frequency pattern detector 420 receives the DAC code 415 from the DAC code generator 410 and determines whether the DAC code 415 indicates a bit pattern having at least a threshold proportion of the same bit and whether the bit is a '1' or a '0'. For example, in the example implementation described above, a DAC code 415 of greater than or equal to +16 can indicate that at least 24 of the 32 bits were '1', and a DAC code 415 of less than or equal to −16 can indicate that at least 24 of the 32 bits were '0'. In other implementations, the low frequency pattern detector 420 receives a trigger signal indicating a "valid" DAC code 415 with a sign, such that the "valid" DAC code trigger signal is asserted only when the DAC code 415 indicates at least a threshold proportion of the same bit, and the sign indicates whether the bit is a '1' or a '0'. Other implementations can use other types of triggers and/or signals to indicate relevant DAC code 415 information to the low frequency pattern detector 420. The term "valid DAC code" is used generally herein to refer to any of these types of triggers and/or signals, including a valid determination made from receiving the DAC code 415 itself.

Some embodiments of the low frequency pattern detector 420 look for a predetermined run length of valid DAC codes to indicate a long string of low-frequency pattern. In some implementations, each time two consecutive valid DAC codes are detected with the same sign, the run length can be incremented; otherwise, the run length is reset to zero or decremented. The run length can be used to indicate that a particular desired low frequency pattern has been detected. For example, when the run length has reached a predetermined value (e.g., 16), a pattern trigger 425 can be asserted to indicate that a long, sufficiently low-frequency bit string has been detected.

In some embodiments, the pattern trigger 425 can trigger the digital gain generator 430 to make a gain adaptation determination. According to some implementations, asserting the pattern trigger 425 can include triggering the start of a voting window and the setting of a sign value according to the sign of the detected valid DAC codes. For example, during the voting window, for each N unit intervals (UIs) used to calculate a DAC code 415, corresponding error samples 435 from the error slicer 254 output can be summed. Embodiments of the digital gain generator 430 can compare the accumulated error information with the DAC code 415 to determine an appropriate gain compensation. In one implementation, if the sum of the accumulated error samples 435 has the same sign as the sign value set from the run length of valid DAC codes, this can indicate a vote for the present gain adaptation overcompensating; and a vote for decreasing the gain compensation can be recorded (e.g., a decrement value ("DEC") can be incremented by 1). If the sum of the accumulated error samples 435 has the opposite sign as the sign value set from the run length of valid DAC codes, this can indicate a vote for the present gain adaptation undercompensating; and a vote for increasing the gain compensation can be recorded (e.g., an increment value ("INC") can be incremented by 1). At the end of the voting window, a gain determination can be made according to a tally of the votes. For example, if INC-DEC is greater than a predetermined threshold, the gain adjustment can be increased (e.g., by 1 dB), and the DEC-INC is greater than a predetermined threshold (the same or a different threshold), the gain adjustment can be decreased (e.g., by 1 dB). Making such gain adjustments in the digital domain can avoid certain settling issues experienced when adjusting gain in the analog domain.

Embodiments of the DAC circuit 264 can use the data samples 405 to generate a DAC output 440. Embodiments of the gain adaptation circuit 262 can use the error samples 435 and the gain adaptation output from the digital gain generator 430 to generate a BWC gain output 450. Embodiments of the analog low-pass filter circuit 268 can receive the DAC output 440 and the BWC gain output 450 and can generate an analog feedback signal 455 as a function thereof. As described with reference to FIGS. 1 and 2, the feedback signal 455 can be fed back to a summer and used for adaptation of receiver functions, such as clock data recovery.

Though not explicitly shown, embodiments can include a blanking circuit to generate a blanking interval, as desired. Baseline wander correction typically relies on relatively accurate bit decisions, and there can be unwanted interactions with other loops during link initialization. For example, when a transmission link is first started, decision feedback equalization (DFE) and other functions may not have properly settled, which can generate a relatively large number of bit errors; if adaptations are run during that time, the bit errors can cause incorrect estimations, which can cause further errors in the DFE (and/or other issues). As such, in some implementations, the BWC circuit 160 can be configured not to operate during some predetermined initialization interval. For example, the DAC code 415 can be held at zero until the feedback equalization loops have sufficiently converged (e.g., based on a predetermined number of cycles, a convergence detection mechanism, etc.).

As noted above, baseline wander is caused by data patterns that have significant low-frequency content. However, counter-intuitively, the low-frequency pattern can be less suited for gain adaptation, because the error signal for these patterns tends to be biased even without baseline wander. Instead, it has been found that the higher frequency pattern that immediately follows the low-frequency pattern is better suited for gain adaptation. In the higher frequency pattern that follows the low-frequency pattern, the error signal tends to be dominated by the residual baseline wander, if the gain adaptation is not correct. By using the low frequency pattern detector 420 and the digital gain generator 430 as described above (e.g., as opposed to using the DAC code generator 410 directly), pattern filtering can be performed prior to using the error signal for gain adaptation, thereby basing the gain adaptation on a better suited signal.

Figure 5:
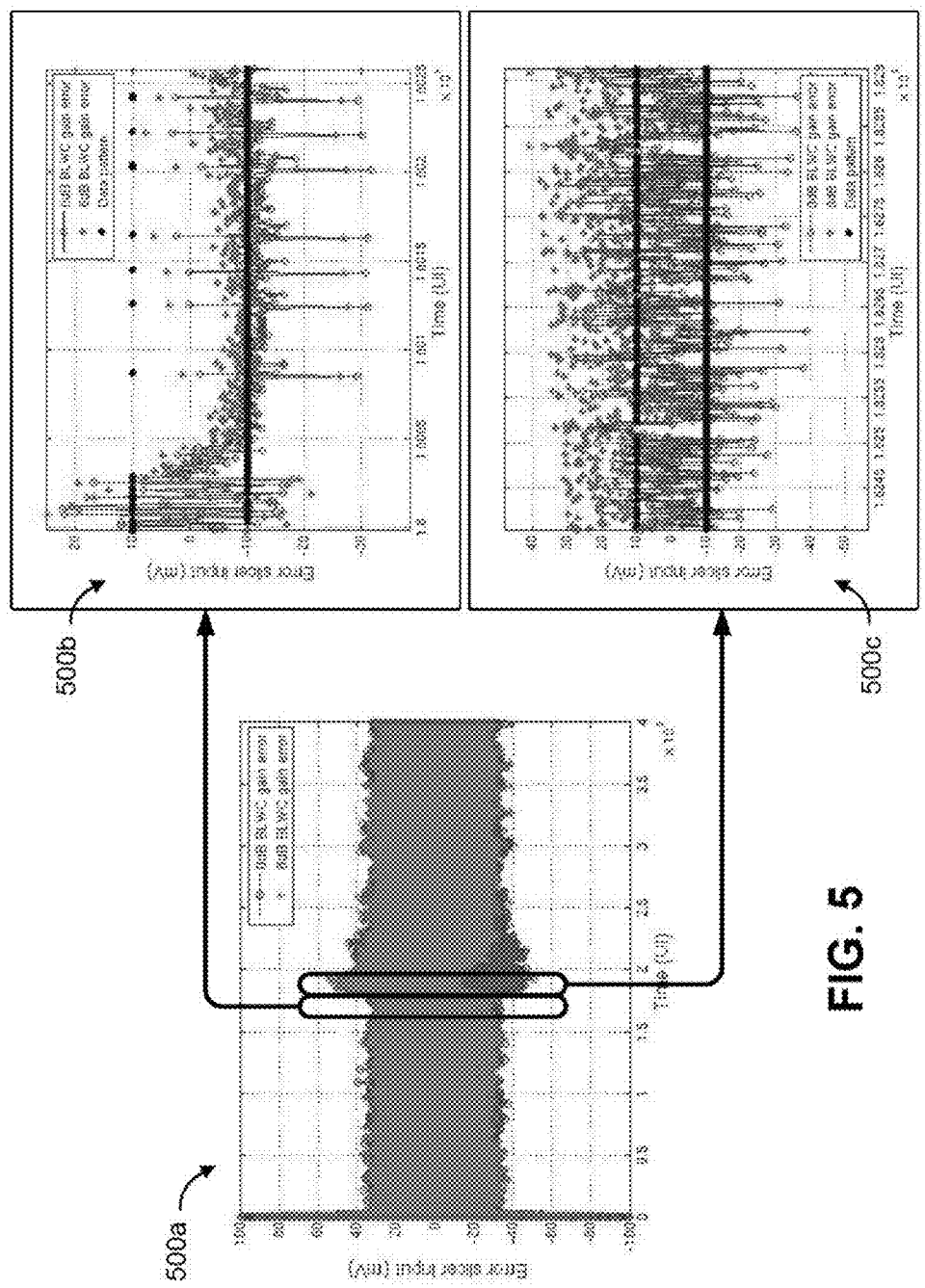
FIG. 5 shows illustrative plots of error slicer inputs.

For the sake of illustration, FIG. 5 shows illustrative plots 500 of error slicer inputs. Plot 500a shows illustrative error slicer input over time having a first region corresponding to a long string of consecutive matching bits followed by a second region corresponding to a relatively high-frequency pattern of bits. Plot 500b zooms in on part of the first region and illustrates that the error information temporally corresponding (i.e., corresponding in time) to long string of consecutive matching bits is biased and is not well-suited for gain adaptation. Plot 500c zooms in on the part of the second region immediately following the first region and illustrates that the error information temporally corresponding to the relatively high-frequency pattern includes gain error information that is well-suited for gain adaptation.

Some embodiments of the systems described above implement various means for performing the functions described herein. Embodiments include means for converting a data signal received via an AC-coupled data channel into an adaptation feedback signal, the adaptation feedback signal generated according to bit data recovered from the data signal and low-pass filtered according to a low-frequency pole that substantially matches an AC pole of the AC-coupled data channel; and means for adapting gain of the adaptation feedback signal as a function of gain error data derived from a portion of the data signal identified as a higher-frequency pattern of the bit data immediately following a lower-frequency pattern of the bit data. For example, the means for converting can be implemented by the various components of the DAC circuit 264 described above, and the means for adapting can be implemented by components of the gain adaptation circuit 262 described above. Some embodiments can further include means for clock data recovery comprising a feedback loop for adapting timing of a sampling clock according to the adaptation feedback signal. For example, such means can be implemented by components of the CDR system 130 described above.

Figure 6:
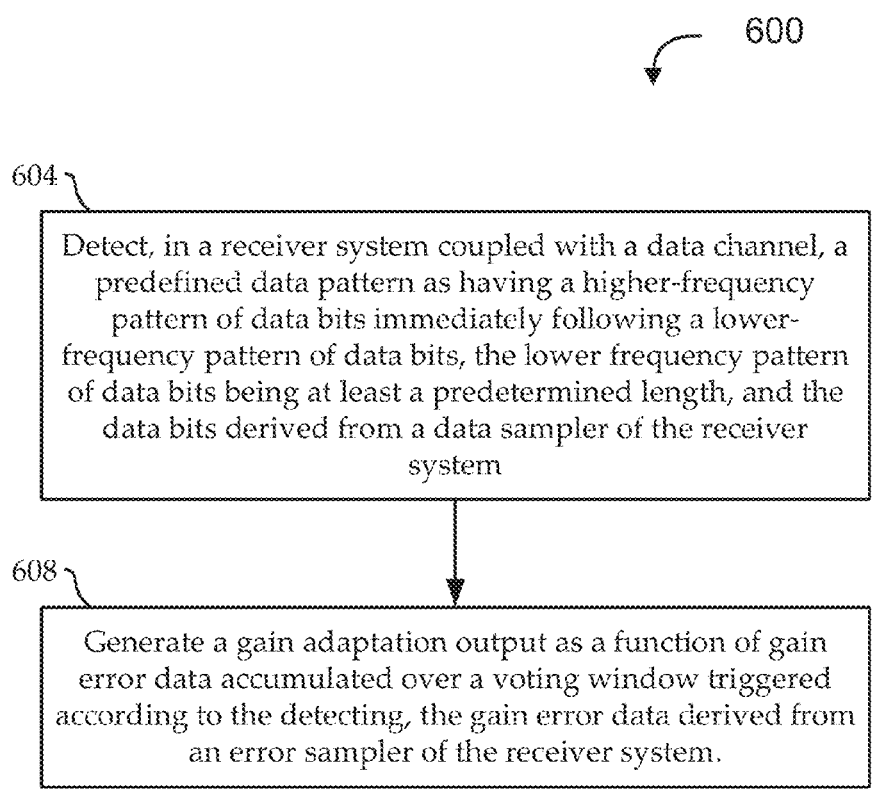
FIG. 6 shows a flow diagram for an illustrative method for baseline wander correction gain adaptation, according to various embodiments.

FIG. 6 shows a flow diagram for an illustrative method 600 for baseline wander correction gain adaptation, according to various embodiments. Embodiments of the method 600 begin at stage 604 by detecting, in a receiver system coupled with a data channel, a predefined data pattern as having a higher-frequency pattern of data bits immediately following a lower-frequency pattern of data bits. As described above, the lower frequency pattern of data bits is at least a predetermined length (e.g., at least a predetermined run length of valid DAC codes having the same sign). The data bits can be derived from a data sampler of the receiver system, such as from a data slicer output of a clock data recovery circuit of the receiver system.

In some embodiments, the data channel is an AC-coupled data channel having a characteristic AC pole frequency, the data bits are derived from a data signal received via the data channel, and the detecting at stage 604 includes low-pass filtering the data signal according to a low-frequency pole that substantially matches the AC pole frequency (e.g., the low-pass filtering is designed to manifest a low-frequency pole that is nominally the same as the AC pole of the AC-coupling circuit). In some implementations, detecting the predefined data pattern can include generating a plurality of DAC codes, each characterizing a corresponding string of N consecutive data bits according to its proportion of matching data bits. For example, generating the plurality of DAC codes can include generating each DAC code to have an absolute magnitude corresponding to how many of the N bits in the characterized string have a matching bit value, and generating each DAC code to have a sign, wherein the sign is a first sign value when the matching bit value is '0', and the sign is a second sign value when the matching bit value is '1'. In some implementations, detecting the predefined data pattern can also include generating a pattern trigger in response to detecting that each of at least a predetermined run length of the plurality of DAC codes comprises at least a threshold proportion of the matching bits (such that the matching bits having a common bit value for all the predetermined run length of the plurality of DAC codes). For example, generating the pattern trigger can include asserting the pattern trigger in response to detecting a predetermined run length of consecutive DAC codes that each indicates at least a threshold proportion of matching bits of the common bit value. In some implementations, detecting the predefined data pattern can also include triggering the voting window according to the pattern trigger. For example, triggering the voting window according to the pattern trigger can include starting the voting window in response to detecting the pattern trigger; generating a plurality of gain adaptation votes during the voting window, each by comparing a DAC code sign indicated by the pattern trigger output with a gain error sign indicated by a corresponding accumulated set of the gain error data; and outputting a gain adaptation decision according to tallying the plurality of gain adaptation votes over the voting window.

At stage 608, embodiments can generate a gain adaptation output as a function of gain error data accumulated over a voting window triggered according to the detecting. The gain error data can be derived from an error sampler of the receiver system, such as from an error slicer output of a clock data recovery circuit of the receiver system.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A receiver system comprising:
   an alternating current coupled (AC-coupled) data input;
   a summer circuit coupled with the AC-coupled data input and a feedback input and having a summer output, the summer output generated according to a sum of the AC-coupled data input and the feedback input;
   a feedback circuit coupled with the summer output and having a data slicer output and an error slicer output, the data slicer output comprising data samples generated according to the summer output, and the error slicer output comprising error samples generated according to the summer output; and
   a baseline wander correction (BWC) circuit coupled with the data slicer output and the error slicer output, and having a feedback output coupled with the feedback input, the feedback output having a gain adapted as a function of gain error data temporally corresponding to a detected data pattern, the gain error data derived from the error slicer output, and the detected data pattern derived from the data slicer output.

2. The receiver system of claim 1, wherein the detected data pattern is derived from the data slicer output by low-pass filtering the data slicer output according to a low-frequency pole that substantially matches an AC pole of the AC-coupled data input.

3. The receiver system of claim 1, wherein the detected data pattern is defined by higher-frequency data immediately following a long string of lower-frequency data.

4. The receiver system of claim 1, wherein the BWC circuit comprises:
   a digital-to-analog converter (DAC) circuit coupled with the data slicer output and having a DAC output generated as a function of the data slicer output;
   a gain adaptation circuit coupled with the error slicer output and having a BWC gain output generated as a function of the error slicer output; and
   a low-pass filter circuit coupled with the DAC output and the BWC gain output and having the feedback output generated as a function of the DAC output and the BWC gain output.

5. The receiver system of claim 1, wherein the BWC circuit comprises:
   a digital-to-analog converter (DAC) circuit coupled with the data slicer output and having:
   a DAC code generator having a DAC code output generated to characterize a string of N consecutive bits according to its proportion of matching bits;
   a low-frequency pattern generator having a pattern trigger output generated, as a function of the DAC code output, to indicate the detected data pattern; and
   a gain generator having a gain adaptation output generated as a function of the pattern trigger output and the gain error data.

6. The receiver system of claim 5, wherein the DAC code output is generated to have an absolute magnitude corresponding to how many of the N bits in the characterized string have a matching bit value, and to have a sign, wherein the sign is a first sign value when the matching bit value is '0', and the sign is a second sign value when the matching bit value is '1'.

7. The receiver system of claim 5, wherein the pattern trigger output is asserted when the DAC code output indicates a predetermined run length of consecutive characterized strings as each having at least a threshold proportion of matching bits of a common matching bit value.

8. The receiver system of claim 5, wherein the gain adaptation output is generated as a function of tallying a plurality of gain adaptation votes, such that, over a voting window triggered by the pattern trigger output, each of the plurality of gain adaptation votes is generated as a function of comparing a DAC code sign indicated by the pattern trigger output with a gain error sign indicated by a corresponding accumulated set of the gain error data.

9. The receiver system of claim 1, wherein the feedback circuit comprises:
   a decision feedback equalizer (DFE) circuit having a recovered data output that corresponds to the summer output, a data sample output comprising the data samples, and an error sample output comprising the error samples;
   a data slicer circuit coupled with the DFE circuit and having the data slicer output; and
   an error slicer circuit coupled with the DFE and having the error slicer output.

10. The receiver system of claim 1, further comprising:
    an equalization and amplification circuit coupled between the summer circuit and the feedback circuit.

11. The receiver system of claim 1, wherein the AC-coupled data input is coupled with a transmitter system via a data channel.

12. A method for baseline wander correction gain adaptation, the method comprising:
    detecting, in a receiver system coupled with a data channel, a predefined data pattern as having a higher-frequency pattern of data bits immediately following a lower-frequency pattern of data bits, the lower frequency pattern of data bits being at least a predetermined length, and the data bits derived from a data sampler of the receiver system; and
    generating a gain adaptation output as a function of gain error data accumulated over a voting window triggered according to the detecting, the gain error data being derived from an error sampler of the receiver system,
    wherein the data channel is an AC-coupled data channel having a characteristic AC pole frequency;
    wherein the data bits are derived from a data signal received via the data channel; and
    wherein the detecting comprises low-pass filtering the data signal according to a low-frequency pole that substantially matches the AC pole frequency.

13. The method of claim 12, wherein detecting the predefined data pattern comprises:
    generating a plurality of DAC codes, each characterizing a corresponding string of N consecutive data bits according to its proportion of matching data bits;
    generating a pattern trigger in response to detecting that each of at least a predetermined run length of the plurality of DAC codes comprises at least a threshold proportion of the matching bits, the matching bits having a common bit value for all the predetermined run length of the plurality of DAC codes; and triggering the voting window according to the pattern trigger.

14. The method of claim 13, wherein generating the plurality of DAC codes comprises:

generating each DAC code to have an absolute magnitude corresponding to how many of the N bits in the characterized string have a matching bit value; and generating each DAC code to have a sign, wherein the sign is a first sign value when the matching bit value is '0', and the sign is a second sign value when the matching bit value is '1'.

15. The method of claim 13, wherein generating the pattern trigger comprises asserting the pattern trigger in response to detecting a predetermined run length of consecutive DAC codes that each indicate at least a threshold proportion of matching bits of the common bit value.

16. The method of claim 13, wherein triggering the voting window according to the pattern trigger comprises:

starting the voting window in response to detecting the pattern trigger;

generating a plurality of gain adaptation votes during the voting window, each by comparing a DAC code sign indicated by the pattern trigger output with a gain error sign indicated by a corresponding accumulated set of the gain error data; and outputting a gain adaptation decision according to tallying the plurality of gain adaptation votes over the voting window.

17. The method of claim 12, wherein:

the receiver system comprises a clock data recovery circuit;

the data sampler is a data slicer; and the error sampler is an error slicer.

18. A system for baseline wander correction gain adaptation, the system comprising:

means for converting a data signal received via an AC-coupled data channel into an adaptation feedback signal, the adaptation feedback signal generated according to bit data recovered from the data signal and low-pass filtered according to a low-frequency pole that substantially matches an AC pole of the AC-coupled data channel; and means for adapting gain of the adaptation feedback signal as a function of gain error data derived from a portion of the data signal identified as a higher-frequency pattern of the bit data immediately following a lower-frequency pattern of the bit data.

19. The system of claim 18, further comprising:

means for clock data recovery comprising a feedback loop for adapting timing of a sampling clock according to the adaptation feedback signal.

20. A method for baseline wander correction gain adaptation, comprising:

detecting, in a receiver system coupled with a data channel, a predefined data pattern as having a higher-frequency pattern of data bits immediately following a lower-frequency pattern of data bits, the lower frequency pattern of data bits being at least a predetermined length, and the data bits derived from a data sampler of the receiver system; and generating a gain adaptation output as a function of gain error data accumulated over a voting window triggered according to the detecting, the gain error data being derived from an error sampler of the receiver system, wherein the detecting the predefined data pattern comprises:

generating a plurality of DAC codes, each characterizing a corresponding string of N consecutive data bits according to its proportion of matching data bits;

generating a pattern trigger in response to detecting that each of at least a predetermined run length of the plurality of DAC codes comprises at least a threshold proportion of the matching bits, the matching bits having a common bit value for all the predetermined run length of the plurality of DAC codes; and triggering the voting window according to the pattern trigger.

21. The method of claim 20, wherein the generating the plurality of DAC codes comprises:

generating each DAC code to have an absolute magnitude corresponding to how many of the N bits in the characterized string have a matching bit value; and generating each DAC code to have a sign, wherein the sign is a first sign value when the matching bit value is '0', and the sign is a second sign value when the matching bit value is '1'.

22. The method of claim 20, wherein the generating the pattern trigger comprises asserting the pattern trigger in response to detecting a predetermined run length of consecutive DAC codes that each indicate at least a threshold proportion of matching bits of the common bit value.

23. The method of claim 20, wherein the triggering the voting window according to the pattern trigger comprises:

starting the voting window in response to detecting the pattern trigger;

generating a plurality of gain adaptation votes during the voting window, each by comparing a DAC code sign indicated by the pattern trigger output with a gain error sign indicated by a corresponding accumulated set of the gain error data; and outputting a gain adaptation decision according to tallying the plurality of gain adaptation votes over the voting window.

24. The method of claim 20, wherein:

the receiver system comprises a clock data recovery circuit;

the data sampler is a data slicer; and the error sampler is an error slicer.

* * * * *